US005671805A

United States Patent [19]

Ståhl et al.

[11] Patent Number: 5,671,805

[45] Date of Patent: Sep. 30, 1997

[54] METHOD AND DEVICE FOR COOLING IN CLOSED SPACES

[75] Inventors: Lennart Ståhl, Stallarholmen; Anders Karström, Bandhagen, both of Sweden

[73] Assignee: Telefonaktiebolaget LM Ericsson, Stockholm, Sweden

[21] Appl. No.: 656,294

[22] PCT Filed: Dec. 19, 1994

[86] PCT No.: PCT/SE94/01223

§ 371 Date: Jun. 13, 1996

§ 102(e) Date: Jun. 13, 1996

[87] PCT Pub. No.: WO95/17805

PCT Pub. Date: Jun. 29, 1995

[30] Foreign Application Priority Data

Dec. 22, 1993 [SE] Sweden ................................ 9304264

[51] Int. Cl.[6] ........................................ F28F 7/00

[52] U.S. Cl. .................................... 165/80.3; 165/104.33; 361/695; 361/724; 257/721

[58] Field of Search ............................ 165/104.33, 80.2, 165/80.3; 257/721; 361/678, 690, 691, 692, 693, 694, 695, 724

[56] References Cited

U.S. PATENT DOCUMENTS 4,535,386 8/1985 Frey, Jr. et al. .............. 165/104.33 X
4,758,925 7/1988 Obata et al. ............................ 361/695
4,901,138 2/1990 Kushibiki et al. ...................... 257/721
5,419,679 5/1995 Gaunt et al. ........................ 361/695 X
5,477,417 12/1995 Ohmori et al. ........................ 361/695

FOREIGN PATENT DOCUMENTS 2906363 8/1980 Germany .............................. 257/721
6094652 7/1981 Japan .................................... 257/721
9171148 9/1984 Japan .................................... 257/721
0119763 6/1985 Japan .................................... 257/721
5160592 6/1993 Japan .................................... 361/695
0984088 12/1982 U.S.S.R. ............................... 361/695

*Primary Examiner*—John Rivell
*Assistant Examiner*—Christopher Atkinson
*Attorney, Agent, or Firm*—Burns, Doane, Swecker & Mathis, L.L.P.

[57] ABSTRACT

A system for cooling heat generating components in a closed space, for example, telecommunications equipment in rack cabinets in an enclosure includes a cooling unit operating with combined displacing air distribution and gravity air flow. Cooled air is distributed at low speed at a bottom of the closed space to contact the components from below. The cooled air displaces warmer air around and in the components for cooling. The warmer air moves upward in the space and is taken into the cooling unit at an upper intake opening. Air flow in the space is at a speed sufficiently low to avoid turbulence and mixing of the cooled and warmed air flows.

8 Claims, 2 Drawing Sheets

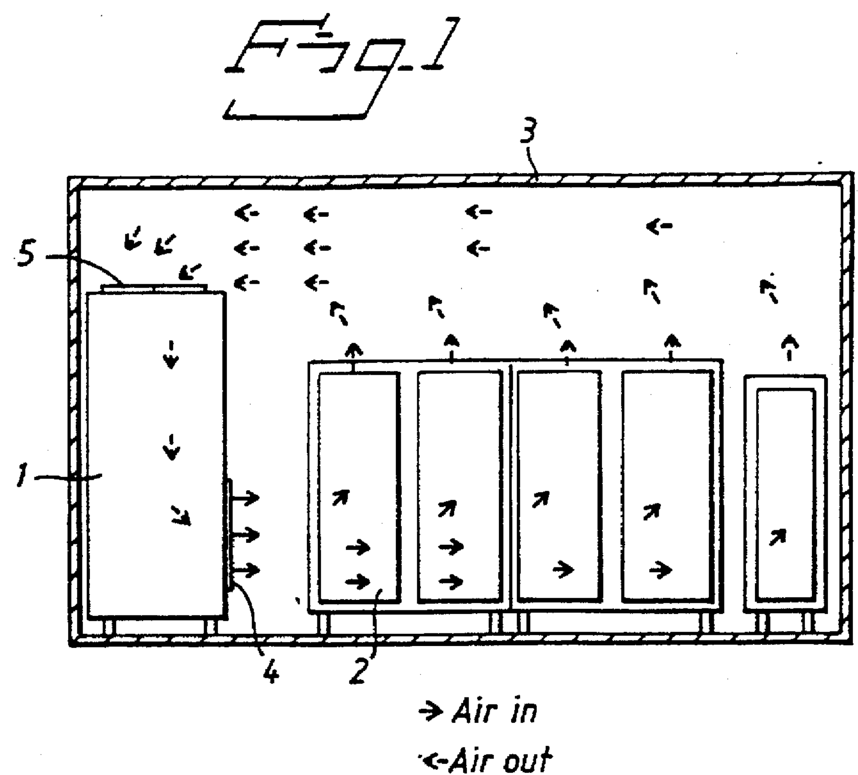
Fig. 1
3
5
1
4
2
→ Air in
<- Air out
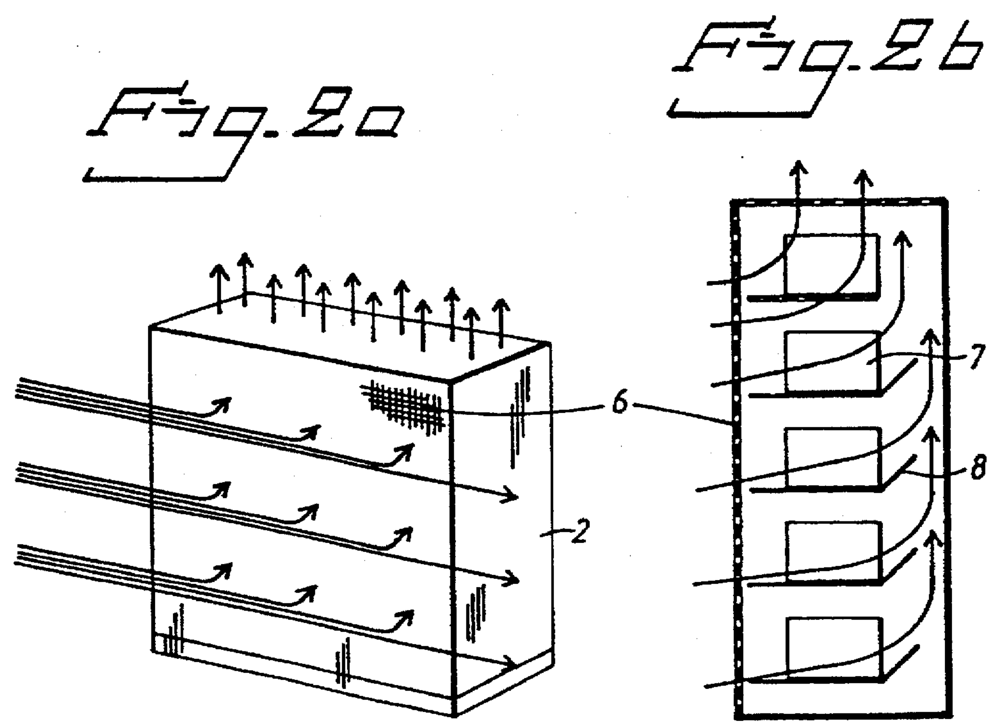
Fig. 2a
Fig. 2b
6
7
8
2

METHOD AND DEVICE FOR COOLING IN CLOSED SPACES

TECHNICAL FIELD

The present invention relates to a method and a unit for cooling devices that are installed in a closed space, for instance telecommunications equipment.

DESCRIPTION OF THE BACKGROUND ART

It is known that the principle of natural convection can be applied to cool vertical surfaces by heating a cold medium to a lower density, wherewith underlying cold medium of higher density will force away the heated medium, causing it to rise. It is also known to distribute air by applying so-called air displacement flow principles. This type of flow functions in accordance with principles that are similar to the principle of natural convection, namely that cold air is heavier than warm air and will therefore take the lowest possible level. When the cold air is released immediately above a floor surface, the cold air will fall down onto the floor and force away air of higher temperature. It is usual to say that the cold air "runs out over the floor". One condition in this respect is that the air speed is low enough not to generate turbulence. Turbulence would cause the cold air to mix with ambient air and the resultant air flow would no longer be a displacing air flow.

SUMMARY OF THE INVENTION

With the intention of cooling telecommunications equipment in rack cabinets installed in closed spaces in an energy-saving manner with high operational reliability and little need of maintenance and with few movable parts, there has been developed a method and a unit for cooling telecommunications equipment installed in rack cabinets placed in closed spaces. The two principles earlier mentioned have been combined and have been applied in apparatus rooms in which cooling of equipment installed therein is necessary. When cooling and heating air, the amount of thermal energy that can be transported via the air per unit of time is determined primarily by two parameters, vis the amount of air cooled (or heated) per unit of time; and the drop (rise) in air temperature.

When the same amount of thermal energy is to be transported per unit of time, these two parameters are the reverse: A large amount of air per unit of time is equivalent to a low difference in air temperature; a high temperature difference requires less air per unit of time. The combination of displacement air distribution (distribution of cold air) and natural convection generated when the air is heated and therewith cooling heat-emitting objects is referred to here as displacement cooling.

BRIEF DESCRIPTION OF THE DRAWINGS

FIG. 1 illustrates a space in which cooling units and cooling equipment according to the invention are installed.

Figure 3:
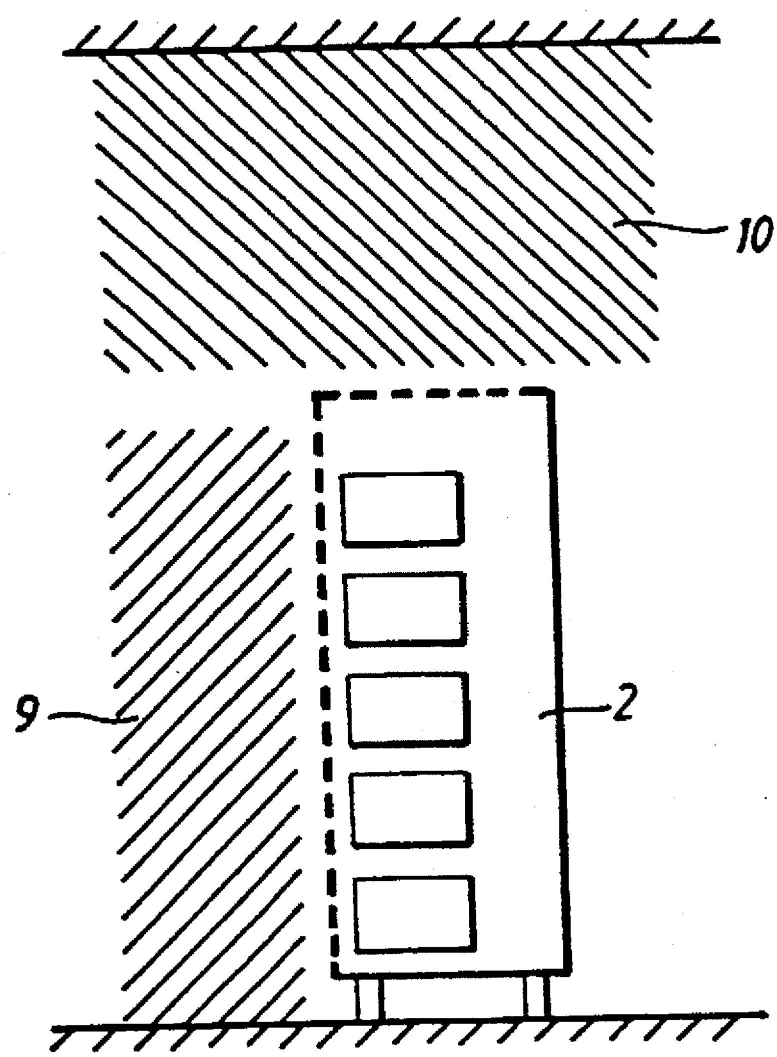

FIG. **2*a*** illustrates the movement pattern of supply air in front of a rack cabinet.

FIG. **2*b*** illustrates the passage of supply air through the rack, as seen from one side thereof.

FIG. 3 shows the layering of warm and cold air in front of and above the cabinet.

DETAILED DESCRIPTION

FIG. 1 shows schematically a cooling unit 1 and equipment 2 to be cooled placed in a space or room 3. The room is assumed to be airtight. The cooling unit 1 is constructed to take in warm air at ceiling level, to cool the air and then to discharge the cooled air at a low speed at floor level. The front surface of the air outlet 4 is large, so as to obtain a low air speed. Return air heated in the room is drawn by suction into a unit intake 5 which is located as close as possible to the ceiling, and is cooled in the unit and returned to the room through the outlet 4, which is located as close to the floor as possible. The cold supply air is distributed at a low speed, i.e. the air disperses into the room to the vicinity of the cabinet in which the heat-generating components to be cooled are located. Cold supply air is now present in front of the cabinet and extends up from the floor to a level immediately beneath the uppermost point of the cabinet.

The air will pass along different routes as it is heated, these routes depending on the construction of the cabinet and the equipment housed therein. A common feature, however, is that cold supply air is drawn by suction into the interior of the cabinet and therewith cools the heat-generating components housed therein, while the warm air exits at the top of the cabinet. The exiting warm exhaust air is much warmer than the supply air in front of the rack and is also lighter in weight and will therefore endeavour to lie between the ceiling and the supply air, see FIG. 3. The warm exhaust air also moves at a speed which is sufficiently low to avoid turbulence. The warm air is drawn slowly back into the cooling unit by suction.

FIG. **2*a* illustrates air flowing in front of and into a cabinet. Normally, the front panels of the cabinet are perforated so as to enable supply air to enter the cabinet. Some of the air passes beyond the first cabinet to an adjacent cabinet, and so on. FIG. 2*b* illustrates supply air passing along the perforated front 6 of the cabinet and in against the heat-generating components 7 located in the cabinet, and then passing upwards through the cabinet. FIG. 2*b* also shows the routes followed by the air through the cabinet when the heat-generating components are seated on shelves 8**. Although not necessary, these shelves may be constructed to guide the heated air towards a chimney means on the rear side of the cabinet. The principle is effective provided that the exhaust air is allowed to rise and to exit on the upper side of the cabinet. A perforated front is not absolutely necessary. However, it must be possible for supply air to enter the lower part of the cabinet structure in order to come into contact with the heat-generated components. Fans may also be mounted in the cabinet for the purpose of drawing in the cold supply air. In summary, three requirements are placed on the cabinet construction:

Supply air shall be able to enter through the front or through the bottom of the cabinet.

The air shall pass in contact with the heat-generating components housed in the cabinet and be heated thereby.

The air shall be allowed to exit from the top of the cabinet.

When following the routes taken by the supply air from the front of the cooling unit up to the location of one of the shelves that support the heat-generating components inside the cabinet, as indicated by the arrows in FIGS. **2*a* and 2*b*, it is found that the temperature remains unchanged along the whole of the route up to this location. The exhaust air exits from the top of the cabinet. The cold supply air 9 and the warm exhaust air 10 are kept separated from one another. The supply air disperses across the floor, from floor level to a point slightly up in front of the cabinet, whereas exhaust air collects beneath the ceiling. FIG. 3** illustrates the state of the two regions in relation to a cabinet seen from one side, and shows layering of warm and cold air in front of and above the cabinet.

The displaced distribution of supply air from the unit and the exit of air from the cabinet with very low turbulence results in two air layers of mutually different temperatures and of low flow rates in mutually different directions, the cold air passing along the floor away from the cooling unit and into the vicinity of all cabinets in the room or space, and warm air flowing along the ceiling away from the cabinet and back to the cooling unit. In turn, this results in the supply air being distributed to all cabinets in the room and being drawn by suction away from all cabinets. In addition, the supply air will have the same temperature in front of all cabinets, provided that the temperature of the supply air exiting from the cooling unit is constant in time. This provides uniform and positive cooling of all cabinets located in the room.

The aforedescribed construction also provides a highly efficient system, due to the fact that a large temperature difference between supply air and exhaust air in the unit combined with a relatively high supply air temperature and therewith vapourization temperature increases the efficiency of the compressor circuit, while the low rate of air flow enables relatively small and energy-lean fans to be used.

We claim:

1. A method for cooling heat-generating components of telecommunications equipment located in a closed space, comprising the steps of:

placing in the closed space a cooling unit;

generating a displacing flow of cool air at a low speed along a floor of the closed space to distribute the flow of cool air for contact with said components to be cooled, drawing by suction warmer air from the ceiling of the closed space, wherein as the warmer air is drawn from the ceiling the cooling air displaces warmer air from beneath the components in an upward flow for heat transfer contact with the components, and cooling air heated by the components exits the components from above.

2. A unit for cooling heat-generating components of telecommunications equipment located in a closed space, comprising:

a cooling unit installed in a closed space having means to deliver a displacing cold air flow at low speed along a floor of the space so that the cold air is distributed to components in the space; the cooling unit including means to drawn by suction air heated by the cooled heat-generating devices from along a ceiling of the space at a low speed, wherein cold air displaces the warmer air and enters the components from beneath as heated air exits the components from above.

3. A unit according to claim 2, comprising a cold air outlet at a bottom of the cooling unit, and a heated air intake at a top of the cooling unit.

4. A unit according to claim 2, further comprising shelves disposed in the heat-generating component to guide the cold air flow through the component.

5. A method according to claim 1, wherein the cooling air speed is sufficiently slow to substantially avoid mixing of cool air with warmer air in the closed space.

6. A unit according to claim 2, wherein said means for delivering cold air is controllable for an air flow at a speed sufficiently slow to substantially avoid mixing cold air with warmer air in the closed space.

7. The method according to claim 1, wherein the displacing flow of cooling air is at a low speed to substantially avoid mixing with warmer air in the enclosure.

8. The unit according to claim 2, wherein the cooling unit means to deliver a displacing cooling air flow is adapted to deliver the cooling air flow at a speed sufficiently slow to avoid substantially mixing with warmer air in the closed space.

* * * * *